(12) United States Patent
Altinger et al.

(10) Patent No.: US 11,148,590 B2
(45) Date of Patent: Oct. 19, 2021

(54) LIGHTING UNIT WITH DATA LINES AND LINE ENDS THEREOF FOR A VEHICLE AND METHOD FOR PRODUCING SAME

(71) Applicant: Bayerische Motoren Werke Aktiengesellschaft, Munich (DE)

(72) Inventors: Florian Altinger, Munich (DE); Juergen Bruegl, Munich (DE); Robert Isele, Fuerstenfeldbruck (DE)

(73) Assignee: Bayerische Motoren Werke Aktiengesellschaft, Munich (DE)

(*) Notice: Subject to any disclaimer, the term of this patent is extended or adjusted under 35 U.S.C. 154(b) by 39 days.

(21) Appl. No.: 16/664,222

(22) Filed: Oct. 25, 2019

(65) Prior Publication Data
US 2020/0055449 A1    Feb. 20, 2020

Related U.S. Application Data

(63) Continuation of application No. PCT/EP2018/066843, filed on Jun. 25, 2018.

(30) Foreign Application Priority Data

Jul. 7, 2017  (DE) ..................... 10 2017 211 659.5

(51) Int. Cl.
*B60Q 3/66* (2017.01)
*B60Q 3/64* (2017.01)
(Continued)

(52) U.S. Cl.
CPC ............... *B60Q 3/66* (2017.02); *B33Y 80/00* (2014.12); *B60Q 3/62* (2017.02); *B60Q 3/64* (2017.02);
(Continued)

(58) Field of Classification Search
CPC ... B60Q 3/62; B60Q 3/64; B60Q 3/66; B60Q 3/745; B60Q 3/80; H05K 1/183; H05K 3/4092; F21S 43/249
See application file for complete search history.

(56) References Cited

U.S. PATENT DOCUMENTS

2005/0243558 A1*  11/2005  Van Duyn .............. F21S 43/15
                                                          362/294
2007/0101573 A1*  5/2007  Masaki .................... H05K 3/10
                                                          29/846
(Continued)

FOREIGN PATENT DOCUMENTS

DE    10 2011 106 251 A1    9/2012
DE    10 2012 015 057 A1    1/2014
(Continued)

OTHER PUBLICATIONS

R. Christ et al, Pulse Width Modulation, 2014, Science Direct (Year: 2014).*

(Continued)

*Primary Examiner* — Keith G. Delahoussaye
(74) *Attorney, Agent, or Firm* — Crowell & Moring LLP

(57) ABSTRACT

A lighting unit for a vehicle has a light source carrier with an arrangement of data lines. The lighting unit also has a plurality of light sources positioned on the light source carrier, each of which has an integrated control unit and which are interconnected via the arrangement of data lines in order to exchange data according to a predefined protocol. The rear face of the light source carrier has a plurality of cavities. The front face of the light source carrier is light-conductive, at least in the region of the cavities. The arrangement of data lines is on the rear face of the light source carrier and the line ends of the data lines lead up to or into the number of cavities. At least one light source is fitted into each of the plurality of cavities, such that each (Continued)

light emission surface is oriented towards the floor of the cavity and the light source is electrically contacted and held in the cavity by electrical and mechanical contact with the line ends of the data lines.

14 Claims, 1 Drawing Sheet

(51) Int. Cl.
*B60Q 3/80* (2017.01)
*B60Q 3/74* (2017.01)
*F21S 43/249* (2018.01)
*H05K 1/18* (2006.01)
*H05K 3/40* (2006.01)
*B33Y 80/00* (2015.01)
*B60Q 3/62* (2017.01)
*F21S 43/14* (2018.01)
*F21S 43/15* (2018.01)

(52) U.S. Cl.
CPC .............. *B60Q 3/745* (2017.02); *B60Q 3/80* (2017.02); *F21S 43/249* (2018.01); *H05K 1/183* (2013.01); *H05K 3/4092* (2013.01); *F21S 43/14* (2018.01); *F21S 43/15* (2018.01); *H05K 2201/0394* (2013.01); *H05K 2201/0397* (2013.01); *H05K 2201/10106* (2013.01)

(56) References Cited

U.S. PATENT DOCUMENTS

2014/0211449 A1 7/2014 Nomura et al.
2017/0254065 A1* 9/2017 Hegenbart .............. E04B 1/343
2018/0050486 A1* 2/2018 Talgorn ................ B33Y 30/00
2018/0257557 A1 9/2018 Bruegl
2019/0299566 A1* 10/2019 Berard ............. B32B 17/10541

FOREIGN PATENT DOCUMENTS

| DE | 10 2014 006 490 A1 | 11/2015 |
| DE | 10 2015 222 505 A1 | 5/2017 |
| DE | 10 2016 121 047 A1 | 5/2017 |
| WO | WO 2015/092014 A1 | 6/2015 |

OTHER PUBLICATIONS

Teknynja, Driving WS2812/NeoPixels RGB LEDS over CAT5 Ethernet Cable, pp. 1-2 (Year: 2014).*
IP.com, Vehicle Interior Light, 2003 (Year: 2003).*
Xu P., "APA101 APA102 Built-in IC SMD LED", Sep. 25, 2018, http://www.rgbledcolor.com/sale-8995239-apa101-apa102-built-in-ic-smd-led.html XP055509907 (four (4) pages).
International Search Report (PCT/ISA/210) issued in PCT Application No. PCT/EP2018/066843 dated Oct. 4, 2018 with English translation (five (5) pages).
German-language Written Opinion (PCT/ISA/237) issued in PCT Application No. PCT/EP2018/066843 dated Oct. 4, 2018 (seven (7) pages).
German-language Search Report issued in counterpart German Application No. 10 2017 211 659.5 dated Feb. 12, 2018 with partial English translation (12 pages).

* cited by examiner

LIGHTING UNIT WITH DATA LINES AND LINE ENDS THEREOF FOR A VEHICLE AND METHOD FOR PRODUCING SAME

CROSS REFERENCE TO RELATED APPLICATIONS

This application is a continuation of PCT International Application No. PCT/EP2018/066843, filed Jun. 25, 2018, which claims priority under 35 U.S.C. § 119 from German Patent Application No. 10 2017 211 659.5, filed Jul. 7, 2017, the entire disclosures of which are herein expressly incorporated by reference.

BACKGROUND AND SUMMARY OF THE INVENTION

The invention relates to a lighting unit for a vehicle and to a method for producing same. The lighting unit comprises a light source carrier having an arrangement of data lines and a plurality of light sources arranged on the light source carrier, each having an integrated control unit, and which are interconnected via the arrangement of the data lines in order to exchange data according to a predefined protocol.

For the lighting of the interior of a vehicle, the employment of outline lighting and/or surface lighting is known, which primarily serves the function of accent lighting. A lighting device of this type comprises one or two light sources and an optical waveguide, wherein the light emitted by the light source is admitted to the surface light guide via an end face of said surface light guide which is configured as a light admission surface. With a lighting device of this type, static lighting effects are possible, i.e. by means of the light source, the brightness can be adjusted between 0% and 100% wherein, however, the brightness of the light guide remains constant over the length thereof. Depending upon the color of light emitted by the light source, it is moreover possible to achieve a specific color effect, which is also constant over the length of the light guide. Interior lighting of this type is known, for example, from DE 10 2012 015 057 A1.

As high-quality interior lighting constitutes a significant design characteristic for a vehicle, a desire exists to be able to more flexibly configure interior lighting. More flexible interior lighting is permitted by the employment of lighting units having a plurality of light sources. Light-emitting diodes (LEDs) are customarily employed as light sources. Both single-color LEDs and RGB-LEDs with a capability for the emission of colored light are actuated e.g. by means of LED drivers, which comprise constant current sources and a pulse-width modulation controller, etc. The actuation of the LED drivers is achieved by means of a central control unit, which actuates the light sources of the lighting unit in a manner required for a specific lighting scenario.

Light sources with an integrated controller are also available, in which the LED driver is integrated in each individual LED, such that only data lines are additionally required for the purposes of actuation. A light source of this type with an integrated controller incorporates e.g. four or six terminals, namely one operating voltage terminal, one ground terminal, one or two data input terminals and one or two data output terminals. Actuation of the light source is executed by the controller which is integrated in said light source. A controller of this type incorporates, for example, a programmable constant current driver, a signal conditioner and a register for each color channel, into which register a number of brightness values are loaded, according to the register width.

These novel light sources with an integrated controller permit the light sources in a lighting source to be ranked in a densely-packed arrangement such that between several tens and over a hundred light sources per meter can be provided on a flat carrier (an "LED strip"). The employment of flat strip carriers is associated with a problem in that, for the provision of uniform lighting, a light output element (e.g. a light guide and/or spreader disk) must be computed and produced in a complex manner. Light output elements are thus distinguished, for example, according to whether the lighting unit is to be integrated in a left-hand or right-hand door panel, to the front or rear, or in an instrument panel of the vehicle. This is also specifically due to the fact that lighting units which are known from the prior art feature an equidistant spacing of light sources on the flat carrier strip.

The object of the invention is the disclosure of a lighting unit for a vehicle and of a method for producing same, which lighting unit, independently of the design of a light output element, permits a uniform output of light and can simultaneously be produced in a simple and cost-effective manner.

These objects are achieved by a lighting unit and by a method for producing said lighting unit according to the claimed invention.

A lighting unit is provided for a vehicle, comprising a light source carrier with an arrangement of data lines and a plurality of light sources arranged on the light source carrier, each of which has an integrated control unit, wherein the light sources are interconnected via the arrangement of the data lines in order to exchange data according to a predefined protocol. The lighting unit can, for example, be an outline lighting facility for the interior lighting of a vehicle, which is provided on or in a door panel, or on or in an instrument panel of the vehicle. Additionally, the lighting unit can moreover be a lighting facility, e.g. an outline lighting facility, provided for the exterior lighting of the vehicle.

In the lighting unit according to the invention, the light source carrier incorporates a plurality of cavities on its reverse side. The cavities can be regularly or irregularly spaced in relation to one another. The cavities can be arranged along a line. The cavities can also be arranged along a plurality of specifically parallel-oriented lines.

On its front side, the light source carrier is light-conductive, at least in the region of the cavities. To this end, the light source carrier, in the region of the cavities, can be configured with a transparent and/or opaque material. The light source carrier can also be configured as transparent or opaque in its entirety. The regions between two adjoining cavities can be light-conductive, but can also be comprised of a non-light-conductive material, or can be optically separated from one another by non-light-conductive material.

The arrangement of data lines is configured on the reverse side of the light source carrier. The line ends of the data lines lead up to or into the number of cavities. At least one light source is fitted into the plurality of cavities in each case. Thus, for example, one light source can be assigned to one cavity. However, it is also contemplated for a plurality of light sources to be inserted in one cavity. Combinations of cavities, in which first cavities accommodate exactly one light source and second cavities respectively accommodate a plurality of light sources, can also be provided.

A respective light source is inserted in the associated cavity such that a respective light outlet surface faces in the direction of the base of the cavity. At the same time, by means of electrical and mechanical contact with the line ends of the data lines, the light source is electrically contacted and is retained in the cavity.

Conversely to the lighting units which are known from the prior art, the light sources are not fitted to a carrier at their reverse side. Instead, the respective light sources are inserted, with their light outlet surface to the fore, in a respective cavity of a correspondingly configured light source carrier, and are contacted at their specifically exposed reverse side. Contacting is achieved by the geometric design of the cavity wherein, by means of a mechanical connection with line ends of the data lines, firstly, retention of the light sources in the cavity is effected, and secondly, simultaneously, the requisite electrical contact is established. The light source carrier, which is light-conductive in the region of the cavities, thus simultaneously assumes the function of a light guide, which would otherwise have to be provided separately. The lighting unit can thus be provided in a simpler and more cost-effective manner.

In the lighting unit provided according to the invention, the spacing of adjoining light sources is dictated by the spacing and the arrangement of the cavities provided in the light source carrier. Depending upon the latter, the lighting unit can comprise sections of different light source densities, depending upon the number of light sources arranged in a respective section. Accordingly, the density of light sources can be varied according to the available installation space. As a result, it is specifically possible to adapt the number of light sources required to the actual light required. Accordingly, more straightforward adaptation to geometrical conditions and constraints at the installation site in the vehicle can be achieved, thereby ensuring the optimum positioning and density of light sources.

According to an appropriate configuration, the light source carrier, on its front side and/or reverse side, assumes a three-dimensional basic shape, which is adapted to the surface profile of a component of the vehicle, to which component the light source carrier is to be attached. The three-dimensional basic shape can be adapted, for example, to the profile of a door panel or an instrument panel. Depending upon the surface profile, the density of light sources, i.e. the distance between two respectively adjoining light sources, can then be taken into account at the design stage by the provision of cavities.

According to an appropriate configuration, in order to be able to achieve the retention of a respective light source in the cavity by means of the data lines which are led up to or into the plurality of cavities, it is provided that the line ends of respective data lines project beyond an edge of the cavity in the direction of said cavity. Accordingly, a light source can be clamped into a cavity by means of the line ends which project beyond an edge of the cavity.

Specifically, it can be provided that at least a proportion of the line ends of respective data lines are curved beyond the edge of the cavity in the direction of the base of the cavity. A spring force of the line ends can thus be employed for the retention of a light source in the cavity. At the same time, a configuration of this type permits a secure electrical contact.

Alternatively or additionally, it can be provided that at least a proportion of the line ends of respective data lines are curved beyond the edge of the cavity away from the base of the cavity. By this arrangement, a spring force can also be generated by the line ends, which acts upon the light source when the latter is inserted in the cavity. As a result, in addition to mechanical retention, effective electrical contact is also ensured.

A particularly simple production of the lighting unit is possible in that the line end sections which, at opposing edges of the cavity, project beyond said edges assume an equal or a different length.

According to a further appropriate configuration, it is provided that a primary contacting side of the plurality of light sources, which faces away from the base of the cavity when the light source is inserted in the cavity, lies flush to the plane of the reverse side of the light source carrier. Alternatively, it can be provided that a primary contacting side of the plurality of light sources, which faces away from the base of the cavity when the light source is inserted in the cavity, projects slightly beyond the plane of the reverse side of the light source carrier. In a further alternative configuration, it can be provided that a primary contacting side of the plurality of light sources, which faces away from the base of the cavity when the light source is inserted in the cavity, is arranged in the cavity such that the primary contacting side does not project beyond the plane of the reverse side of the light source carrier.

These different configurations, by interaction with the configuration of the design of the line ends which project into the cavity, permit the exertion of a clamping force for the mechanical retention of the light source in the cavity, and for the electrical contacting of terminal surfaces of the light sources.

According to a further appropriate configuration, it is provided that the base of at least a proportion of the cavities is configured as an optical surface. By the configuration of the base as an optical surface, it is possible for the light emitted from the light outlet surface of a respective light source to be admitted into the light source carrier in a targeted or directed manner, and emitted from the latter in a desired manner. By interaction with an optional spreader disk, a desired lighting effect and light distribution can then be achieved.

According to an appropriate configuration, the light source carrier can be configured as a light guide which, at least in the region of the cavities, is transparent or opaque. As a result, the provision of a light guide, which would otherwise have to be separately provided and into which the light emitted from a respective light source is admitted for the further relay thereof, can be omitted. This simplifies assembly and reduces production costs.

According to a further configuration, it is provided that the base of at least a proportion of the cavities is constituted by an optical component, e.g. a lens, which is inserted in the light source carrier on the front side of the latter. As a result, e.g. depending upon the available installation space, light can be released from the lighting unit in a targeted manner.

The invention further provides a method for producing a lighting unit of the type described herein. The method comprises the following steps: provision of the light source carrier having a front side and a reverse side which, in the region of the reverse side, incorporates a plurality of cavities and, at its front side, at least in the region of the cavities, is light-conductive; fitting of the arrangement of data lines to the light source carrier; insertion of at least one light source respectively into the plurality of cavities such that a respective light outlet surface of the light sources faces in the direction of the base of the cavity and, by means of electrical and mechanical contact with the line ends of the data lines, the light source is electrically contacted and retained in the cavity.

The lighting unit described according to the invention can be formed in a particularly simple and cost-effective manner if the light source carrier is formed by 3D printing. This provides a particularly simple option for the constitution of the light source carrier in a three-dimensional basic shape, and for the provision of the desired number of cavities at the desired locations on the reverse side. During the formation thereof by 3D printing, the three-dimensional basic shape already takes account of the surface profile of a component of the vehicle to which the light source carrier is to be attached. A vehicle component of this type can be, for example, a door panel or the instrument panel.

It is particularly appropriate if the arrangement of data lines is likewise formed by 3D printing. The formation of the data lines by 3D printing permits the latter to project beyond the edges of the cavities in the above-described manner. By means of the 3D printing method, it is also possible for any desired curvatures in the line ends which project into the cavity to be constituted. By this arrangement, any properties which are lacking can be conferred upon the line ends of the data lines, with no further complexity.

The formation of the data lines can proceed in a temporally independent manner from the formation of the light source carrier by 3D printing. In another configuration, it is also possible for the light source carrier and the arrangement of data lines to be produced by 3D printing in a single processing step.

For the insertion of the light sources in the cavity, it is appropriate for a respective light source to be clipped into the cavity which is assigned thereto. This can be executed, for example, by a robot using the pick-and-place method.

Other objects, advantages and novel features of the present invention will become apparent from the following detailed description of one or more preferred embodiments when considered in conjunction with the accompanying drawings.

DETAILED DESCRIPTION OF THE DRAWINGS

Figure 1:
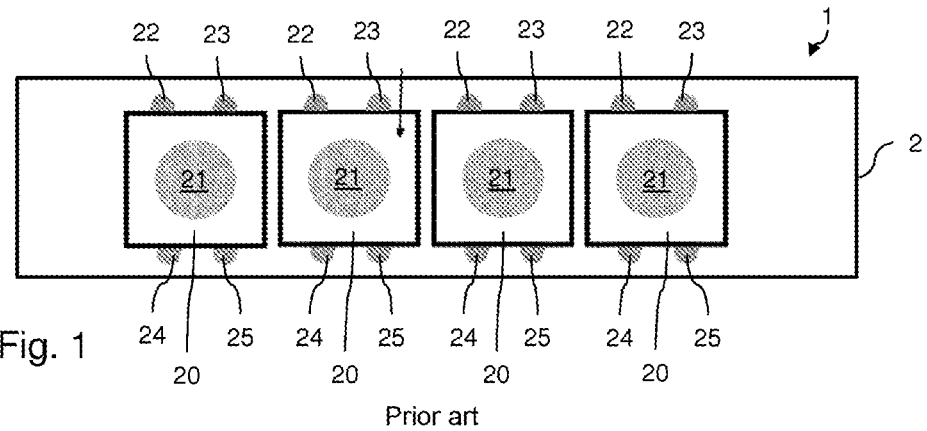
FIG. 1 is a schematic overhead view of a lighting unit known from the prior art, in which a plurality of light sources are applied to a flat carrier strip.

FIG. 1 shows an overhead view of a schematic, known lighting unit 1, of the type which might be employed, for example, for outline lighting in a vehicle.

A flat light source strip 2 serves as a carrier for a plurality of light sources 20 which are arranged next to one another on the light source strip 2. As light sources 20, e.g. light-emitting diodes (LEDs) are employed. Both single-color and RGB-LEDs capable of outputting colored light can be employed. The output of white or colored light proceeds via a light outlet surface 21, which is arranged on the primary surface of the light sources 20 which is averted from the light source strip 2. Each of the light sources 20 has an integrated controller (which is not represented in the figures), wherein an LED driver is integrated in each individual LED. By means of a respective LED driver, which comprises a constant current source and a pulse-width modulation controller, the light sources 20 are actuated in a manner which is required for a specific output of light.

For the actuation of the light sources, only data lines are required. These data lines, which are not explicitly represented in FIG. 1, are provided on and/or in the light source strip 2. In this exemplary embodiment, connection to the data line is executed via four terminal points 22, 23, 24, 25, namely an operating voltage terminal, a ground terminal, a data input terminal and a data output terminal. Depending upon the configuration of the data lines, a respective light source 20 can also have a larger number of terminal points. For example, six terminal points are also customary, namely an operating voltage terminal, a ground terminal, two data input terminals and two data output terminals. In this variant, the data inputs and outputs can be configured as differential signal inputs and outputs (data high and data low). In the following description, in the interests of simplicity, light sources with four terminal points are assumed.

The data lines can be configured as buses. Actuation of the light sources 20, which are arranged next to one another spaced apart at regular intervals on the light source strip 2, is executed by means of the respective controller which is integrated in the light source. Said controller incorporates, for example, a programmable constant current driver, a signal conditioner and a register for each color channel, into which register a number of brightness values are loaded, according to the register width.

A lighting unit 1 configured in this manner, in which the light sources 20 comprise an integrated controller, permits the light sources 20 to be ordered in a densely packed arrangement, such that from several tens to over 100 light sources can be provided per meter. The production of the components represented in FIG. 1 can be executed in a continuous manner. This means that the light source strip, with the light sources arranged thereupon, is only trimmed to the requisite length and combined with a light guide and a spreader disk to constitute a lighting unit upon the fitting thereof in a component of the vehicle, e.g. a door panel (front left, front right, rear left or rear right) or an instrument panel. This lighting unit is then arranged on the intended component in the vehicle.

By this method, structural restrictions apply with respect to shape, the density of the light-emitting diodes 20 and the depth to the light guide or spreader disk. Any variations in the spacing of the light outlet surfaces 21 with respect to the surface of the light guide must be compensated by the arrangement and design of the light guide and/or of the spreader disk.

Figure 2:
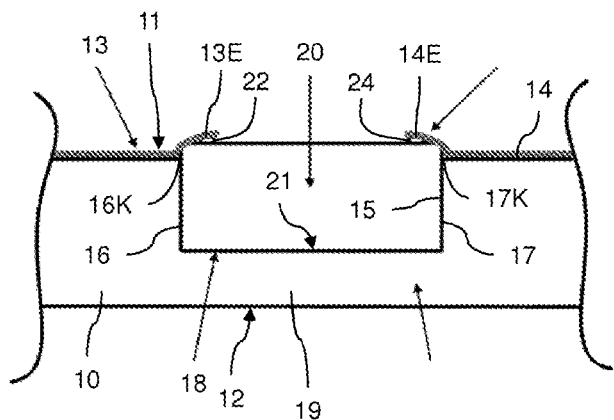
FIG. 2 is a cross-sectional representation of a section of a lighting unit according to an embodiment of the invention, in which the arrangement of a light source in a cavity can be seen.
Figure 3:
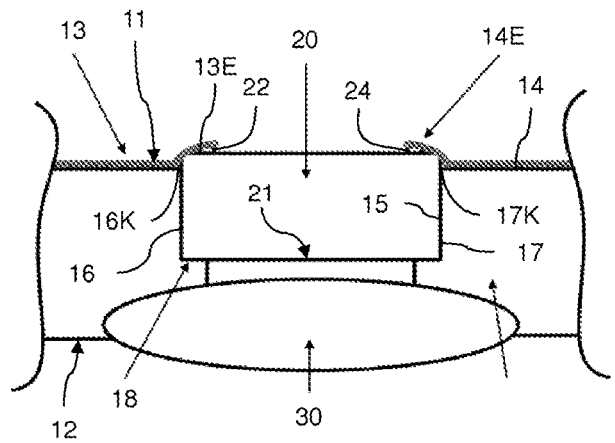
FIG. 3 shows an alternative configuration variant in which the light source carrier, in the region of the cavity, is provided with an optical component.

FIGS. 2 and 3 respectively represent cross-sections through part of a lighting unit according to the invention which, as a result of the structural design and manufacturing process thereof, can be or are innately adapted to the surface profile of the vehicle component.

As a carrier for the plurality of light sources 20 of which, in the exemplary embodiments according to FIGS. 2 and 3, only one is illustrated for representative purposes, a light source carrier 10 is employed, which is formed by 3D printing and assumes a three-dimensional basic shape which is adapted to the surface profile of the component of the vehicle to which the light source carrier 10 is to be attached. As a result of the only sectional representation of the lighting unit 1 in FIGS. 2 and 3, the three-dimensional basic shape cannot be seen, however.

The light source carrier 10 comprises a reverse side 11 and a front side 12. On the reverse side 11, a cavity 15 is preferably provided for each light source 20. In one form of embodiment, a plurality of light sources 20 might also be arranged in a single cavity 15. On the front side 12, the light source carrier 10 is light-conductive, at least in the region 19 of the cavity 15. The light source 20 is inserted in the cavity 15 such that the light outlet surface 21 thereof faces in the direction of a base 18 of the cavity 15. In the exemplary embodiment represented in FIG. 2, the light source 20, by way of its primary side incorporating the light outlet surface 21, is adjacent, in its full extent, to the base 18 of the cavity 15. In this exemplary embodiment, the depth of the cavity 15 is dimensioned, for example, such that a contacting reverse side of the light source 20, i.e. a primary surface opposite to the primary surface which incorporates the light outlet surface 21, projects beyond a plane of the reverse side 11 of the light source carrier. On the primary contacting side, the light source 20 incorporates the terminal points 22, . . . , 24 of which, in the cross-sectional representations shown in FIGS. 2 and 3, only the mutually opposing terminal points 22, 24 can be seen.

On the light source carrier 10, the above-mentioned arrangement of data lines is provided. More specifically, the arrangement of data lines 13, 14 is configured on the reverse side 11 of the light source carrier 10. Respective line ends 13E, 14E of the data lines 13, 14, which can be seen in the cross-sectional representations, are led up to the cavity 15 and project beyond edges 16K, 17K of the sidewalls 16, 17 of the cavity 15. In this exemplary embodiment, the line ends 13E, 14E project beyond the plane of the reverse side of the light source carrier 10. As a result of a spring action, the line ends 13E, 14E exert pressure in the direction of the contacting reverse side of the light source 20, and thus engage in electrical and mechanical contact with the terminal points 22, 24. As a result, electrical contacting between the terminal point 22 and the line end 13E, and between the terminal point 24 and the line end 14E is established, and the light source 20 is simultaneously retained in the cavity 15.

In an alternative configuration, the primary contacting side of light source 20 might also lie flush to the plane of the reverse side 11 of the light source carrier 10. It is also contemplated that, when the light source 20 is inserted in the cavity 15, the primary contacting side of the light source 20 does not project beyond the plane of the reverse side of the light source carrier. This means that the depth of the cavity 15 exceeds the height of the light source 20.

The insertion of the light source 20 in the cavity 15 can be achieved by means of clip-fitting. To this end, conversely to the representation shown in the drawing, it can be appropriate that the width of the cavity is slightly greater than the edge length of the light source 20. As a result, the light source 20 can be obliquely inserted into the cavity 15 such that one lateral edge of the light source 20 is preferably positioned below e.g. the line end 14E, and the other opposing lateral edge of the light source 20 can then be pressed in the direction of the base 18 of the cavity 15.

The clip-fitting or insertion of the light source 20 in the cavity 15 can also be executed such that, during the insertion process, the primary sides of the light source 20 remain parallel to the base 18 of the cavity 15. During insertion, the line ends 13E, 14E can be pressed downwards into a gap between the lateral edge of the light source 20 and the associated wall 16 or 17. This method requires a specific design of the contacting surfaces 22, 24 which is configured not only on the contacting reverse side, but also on the lateral edge surfaces of the light guide 20 which face the sidewalls 16, 17.

The contacting and simultaneous mechanical retention represented in FIGS. 2 and 3 thus illustrate the method according to the invention in a schematic manner only. It will be evident to a person skilled in the art that, by the corresponding configuration of the line ends 13E, 14E, and of the associated terminal points 22, 24, various options for contacting and retention are available. As a result, a spring action or clamping force of the line ends 13E, 14E is intended to be exploited such that, in addition to electrical contacting, the mechanical retention of the light source 20 in the cavity 15 is also undertaken.

In this connection, it will also be evident to a person skilled in the art that the length of the line ends 13E, 14E projecting into the cavity does not need to be equal. Specifically, mutually opposing line ends 13E, 14E can assume a different length, which is specifically conducive to oblique clip-fitting. In this configuration, it is appropriate that the line ends arranged along a lateral edge 16K or 17K assume an equal length, whereas the line ends of opposing data lines assume a length differing therefrom.

If, as represented in FIG. 2, the primary surface of the light guide in which the light outlet surface 21 is configured adjoins the base, light emitted from the light outlet surface 21 can be emitted from the light source carrier 10 at the front side 12, through the light-conductive region 19. A spreader disk, which is not represented, can be provided adjacently to the front side 12.

The material of the light source carrier 10 can be selected such that the latter, in its entirety, is configured as a light guide. In another configuration, it is sufficient if only the region 19 arranged between the base 18 of the cavity 15 and the front side 12 is light-conductive. To this end, the material can be transparent or opaque.

In the exemplary embodiment represented in FIG. 3, the base 18 of the cavity 15 incorporates a recess into which, from the front side 12, an optical component 30, e.g. a lens, is inserted. As a result, specific and desired manners of conducting light can be achieved.

The formation of the data lines 13, 14, just like the formation of the light source carrier 10, can be achieved by means of 3D printing. It is thus possible for the light source carrier 10 to be formed firstly, and the data lines 13, 14 thereafter. Printing methods are also possible in which both components can be formed in a single process step. By the employment of a 3D printing method, it is possible for the basic shape of the light source carrier 10 to be adapted as required to the surface profile of the vehicle component. The cavities are provided at a spacing in the light source carrier 10 which corresponds to the requirement of the light sources.

As the light sources 20 are suitable for clip-fitting in the cavity 15, e.g. by means of a pick-and-place robot, a soldering process for the purposes of electrical contacting can be omitted. In order to prevent the insertion of the light source 20 into the cavity in an incorrect position, the cavity 15 can incorporate an orientation feature, e.g. a projection which, subject to correct positioning, engages in a corresponding recess in the light source 20. Any incorrect insertion of the light source 20 into the cavity 15 can be prevented accordingly.

In a further configuration, a light source carrier 10 does not necessarily need to be provided as a separate component, but can instead be constituted by the surface of a door panel or an instrument panel, in which the lighting unit is provided. Accordingly, there is no necessity for flat surfaces, of the type required for the flat LED strips described in conjunction with FIG. 1. By the option for the provision of the light sources or cavities 15 in a manner requisite for the light distribution, the density of the light sources 20 can be varied in a simple manner, according to the available installation space. As a result, the number of light sources 20 can be dimensioned in accordance with requirements.

LIST OF REFERENCE NUMBERS

1 Lighting unit
2 Light source strip
10 Light source carrier
11 Reverse side of light source carrier
12 Front side of light source carrier
13 Data line
13E Line end of data line 13
14 Data line
14E Line end of data line 14
15 Cavity
16 Sidewall
16K Edge of sidewall 16
17 Sidewall
17K Edge of sidewall 17
18 Base
19 Region of light source carrier 10 below the cavity 15
20 Light source
21 Light outlet surface
22 Terminal point
23 Terminal point
24 Terminal point
25 Terminal point
30 Optical component The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A lighting unit for a vehicle, comprising:
    a light source carrier having an arrangement of data lines;
    a plurality of light sources arranged on the light source carrier, each having an integrated control unit, which are interconnected via the arrangement of the data lines in order to exchange data according to a predefined protocol;
    wherein
    the light source carrier incorporates a plurality of cavities on a rear side;
    the light source carrier is light-conductive on a front side, at least in the region of the cavities;
    the arrangement of data lines is configured on the rear side of the light source carrier, wherein line ends of the data lines lead up to or into the number of cavities;
    at least one light source is fitted into the plurality of cavities in each case such that:
        (i) a respective light outlet surface faces in a direction of a base of the cavity, and
        (ii) by way of electrical and mechanical contact with the line ends of the data lines, the light source is electrically contacted and is retained in the cavity,
    wherein a primary contacting side of the plurality of light sources, which faces away from the base of the cavity when the light source is inserted in the cavity, projects slightly beyond a plane of the rear side of the light source carrier, and
    wherein the line ends of the data lines provide a spring force that retains the plurality of light sources in the plurality of cavities.

2. The lighting unit according to claim 1, wherein the light source carrier, on the front side and/or the rear side, assumes a three-dimensional basic shape, which is adapted to a surface profile of a component of the vehicle, to which component the light source carrier is to be attached.

3. The lighting unit according to claim 1, wherein the line ends of respective data lines project beyond an edge of the cavity in the direction of said cavity.

4. The lighting unit according to claim 3, wherein at least a proportion of the line ends of respective data lines are curved beyond the edge of the cavity in the direction of the base of the cavity.

5. The lighting unit according to claim 3, wherein at least a proportion of the line ends of respective data lines are curved beyond the edge of the cavity away from the base of the cavity.

6. The lighting unit according to claim 3, wherein line end sections which, at opposing edges of the cavity, project beyond said edges assume an equal or a different length.

7. The lighting unit according to claim 1, wherein the base of at least a proportion of the cavities is configured as an optical surface.

8. The lighting unit according to claim 7, wherein the light source carrier is a light guide which is transparent or opaque, at least in the region of the cavities.

9. The lighting unit according to claim 7, wherein the base of at least a proportion of the cavities is constituted by an optical component, which is inserted in the light source carrier on the front side of the carrier.

10. A method for producing a lighting unit, comprising:
    providing a light source carrier having a front side and a rear side which, in the region of the rear side, incorporates a plurality of cavities and, at the front side, at least in the region of the cavities, is light-conductive;
    fitting an arrangement of data lines to the light source carrier;
    inserting at least one light source, respectively, into each of the plurality of cavities such that:
        (i) a respective light outlet surface of the light source faces in the direction of the base of the cavity, and
        (ii) by way of electrical and mechanical contact with line ends of the data lines, the light source is electrically contacted and retained in the cavity,
    wherein a primary contacting side of the at least one light source, which faces away from the base of the cavity when the at least one light source is inserted in each of the plurality of cavities, projects slightly beyond a plane of the rear side of the light source carrier, and
    wherein the line ends of the data lines provide a spring force that retains the at least one light source in the plurality of cavities.

11. The method according to claim 10, wherein the light source carrier is formed by 3D printing.

12. The method according to claim 11, wherein the arrangement of data lines is formed by 3D printing.

13. The method according to claim 10, wherein the light source carrier and the arrangement of data lines are formed by 3D printing in a single process step.

14. The method according to claim 10, wherein a respective light source is clipped into the associated cavity.

* * * * *